United States Patent [19]

Wakasa et al.

[11] 4,086,570
[45] Apr. 25, 1978

[54] CONTROLLED DC CURRENT SUPPLY DEVICE WITH OPEN CIRCUIT DETECTING MEANS

[75] Inventors: Yutaka Wakasa; Hisayuki Uchiike, both of Musashino, Japan

[73] Assignee: Yokogawa Electric Works, Ltd., Tokyo, Japan

[21] Appl. No.: 674,915

[22] Filed: Apr. 8, 1976

[30] Foreign Application Priority Data

Apr. 21, 1975 Japan ............................... 50-48451

[51] Int. Cl.$^2$ ............................................. H04Q 9/16
[52] U.S. Cl. ................................. 340/172; 340/253 B; 340/256; 340/409
[58] Field of Search ............... 340/409 R, 253 B, 292, 340/248 A, 248 E, 248 R, 172, 256

[56] References Cited

U.S. PATENT DOCUMENTS

| Re. 28,692 | 1/1976 | Highstone | 340/409 X |
| 3,210,751 | 10/1965 | Shirashi | 340/253 B |
| 3,706,983 | 12/1972 | Olson | 340/253 B |
| 3,706,987 | 12/1972 | Westphal | 340/253 B |

Primary Examiner—Harold I. Pitts
Attorney, Agent, or Firm—Parmelee, Johnson, Bollinger & Bramblett

[57] ABSTRACT

A control system of the type used in process control and comprising a controller which provides a control signal on a signal line, and a DC output circuit for converting the control signal on the signal line into a DC current output signal varying in a range of, e.g., 4 to 20 milliamperes, which is supplied to a current loop including one or more load devices. The control system is characterized by open circuit detecting means for detecting an open circuit condition in the load current loop by detecting the fall of the DC current output signal below a predetermined minimum value, and shorting means in the DC output circuit for shorting the signal line in response to detection of an open circuit condition. Level detecting means are provided for detecting the shorting of the signal line, and thus an indication of an open-circuited load condition may be supplied back to the controller without requiring added signal carrying lines.

5 Claims, 4 Drawing Figures

CONTROLLED DC CURRENT SUPPLY DEVICE WITH OPEN CIRCUIT DETECTING MEANS

BACKGROUND OF THE INVENTION

1. Field of the Invention

This invention relates to control systems of the type used, e.g., in process control to supply DC current signals, varying in a prescribed range, to a current loop including one or more load devices. More particularly, the invention relates to the detection of open circuit conditions in the load current loop.

2. Description of the Prior Art

Control systems which effect control through a DC current signal are widely known. The control current varies, for example, in a range of from 4 to 20 milliamperes to correspond to a variation of control from zero to 100 percent of scale. The DC current signal typically is applied serially to two or three final control elements. It has been found that in practice, open circuit conditions may occur in the output current loop.

Various arrangements for responding to such open circuit conditions are known. Upon the occurrence of an open circuit, the loop current falls below the minimum current value of, e.g., 4 milliamperes. In some prior art control systems, detection of an output current below 4 milliamperes causes an alarm to be generated. In most systems, however, an indication of an open condition is not supplied back to the controller, and the controller continues to send out control signals, which may result in undesirable effects on other control systems of a process. These effects are undesirable especially in large scale control systems. One prior art solution to this problem is to supply an open circuit detection signal back to the controller through an extra cable. However, the installation of such a cable is costly and not entirely satisfactory. Thus, none of the prior art control systems provides a simple and effective way of indicating to the controller that an open circuit load condition exists.

SUMMARY OF THE INVENTION

A principal object of the present invention is to provide an improved control system for supplying DC control currents to load devices. It is a further object of the invention to provide such a control device which detects the occurrence of open circuits in the output loop, and which is capable of automatically supplying an indication of such a condition back to the controller, without necessitating the use of extra cables.

In a preferred embodiment of the invention to be described hereinbelow in detail, the control system is of the type comprising controller means for providing a control signal on a signal line, and DC output means for converting the control signal on the signal line into a DC current output signal for supply to a current loop including one or more load devices. In such a control system, there are provided open circuit detecting means for detecting an open circuit condition in the load current loop, shorting means in the DC output means for shorting the signal line in response to detection of an open circuit condition, and level detecting means for detecting the shorting of the signal line. Accordingly, an open circuit load condition is made to correspond to a shorted condition of the signal line, which is transmitted back to the controller means for detection without requiring added signal carrying lines.

In a further aspect of the invention, the DC output means comprises an operational amplifier and means for feeding back the voltage of the load current loop to the input of the operational amplifier. The open circuit detecting means responds to the output voltage of the operational amplifier, to cause a diode to become conductive upon the occurrence of an open circuit condition to generate a signal to cause a transistor, connected across the signal line, to become conductive and form a short.

Other objects, aspects and advantages of the invention will be pointed out in, or apparent from, the detailed description hereinbelow considered together with the following drawings.

DESCRIPTION OF THE PREFERRED EMBODIMENTS

Figure 1:
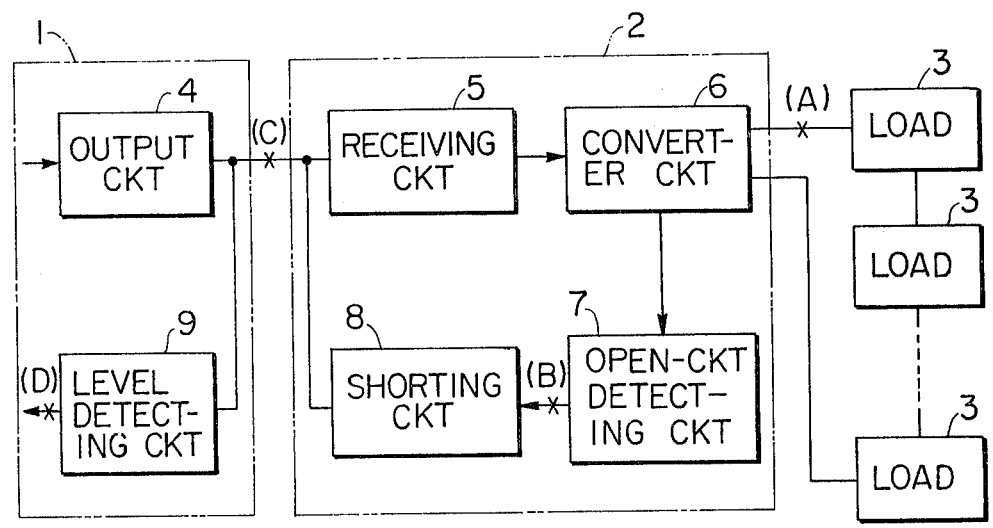
FIG. 1 is a block diagram of a control system constructed in accordance with the present invention.

FIG. 1 illustrates, in block form, a control system arranged with a controller device 1 for providing a control signal, a DC output device 2 for converting the control signal into a DC current output signal varying in a range above a predetermined minimum value, and loads 3 in a current loop through which the DC current output signal is passed. In greater detail, the controller device 1 comprises a control signal output circuit 4 which emits a control signal, e.g., a pulse-width modulated signal, to be carried on a signal line (indicated at point C) to the DC output device 2. The DC output device 2 comprises a receiving circuit 5 accepting the control signal carried on the signal line, and a converter circuit 6 which converts the pulse-width control signal into a DC current signal varying over a prescribed range above a predetermined minimum value, e.g., in a range of 4 to 20 milliamperes. The DC current signal, at point A, is supplied to the plurality of serially connected loads 3, each having a resistance of, e.g., 250 ohms and being connected to a final control element such as a control valve.

In accordance with the present invention, within the DC output device 2 there is located an open-circuit detecting circuit 7 which is arranged to generate an output whenever the DC current at point A falls below the predetermined minimum value at the lower end of the prescribed range. In the example given previously, an open circuit condition corresponds to the falling of the DC current below 4 milliamperes. Whenever an open circuit is detected, and a signal appears at point B, a shorting circuit 8 within the DC output device 2 responds by developing a short circuited condition across the signal line (point C). The shorted condition within the signal line is detected by a level detecting circuit 9 within the controller device 1. An indication that an open circuit condition exists is supplied at point D to the controller, so that the controller can be aware of the condition and take appropriate action. In accordance with the present invention, such an indication is supplied back to the controller directly over the signal line, without requiring any extra cables. In large scale processes, the length of such signal lines may be significant, and the cost saving in avoiding the use of an extra cable can be large. Moreover, once a short is applied at the input of DC output device 2, the control signal from the controller device 1 no longer will be applied to the circuitry of device 2.

Figure 2:
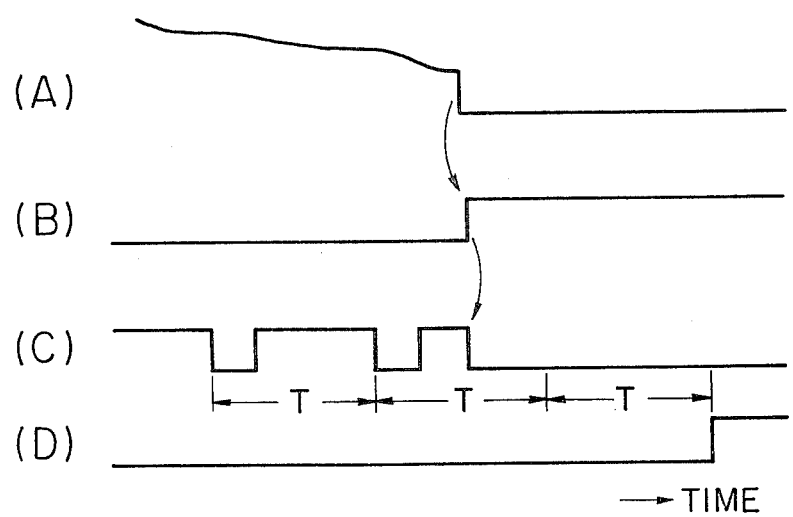
FIG. 2 is a graph illustrating waveforms present in the system shown in FIG. 1.

The operation of the control system of FIG. 1 is illustrated by the waveforms of FIG. 2. The control signal at point C is a pulse-width signal in which pulse width is varied within the repeating period T of the signal. The DC current signal, at point A, varies within its prescribed range of 4 to 20 milliamperes in correspondence with the width of the pulses in the control signal at point C. When the DC current signal at point A drops to zero, which indicates that an open circuit condition exists in the load current loop, the open circuit detecting circuit 7 develops an output at point B. The shorting circuit 8 places a short across the signal line, and thus the control signal has its voltage dropped to a low value. The low value of the control signal will persist over a full period T, and level detecting circuit 9 recognizes this condition and emits an output signal at point D for use by the controller. The level detecting circuit 9 may comprise, for example, a timing means which is reset by pulse signals within the period T and arranged to emit an output when its timing period expires without being reset, which corresponds to the shorted condition of the signal line.

Figure 3:
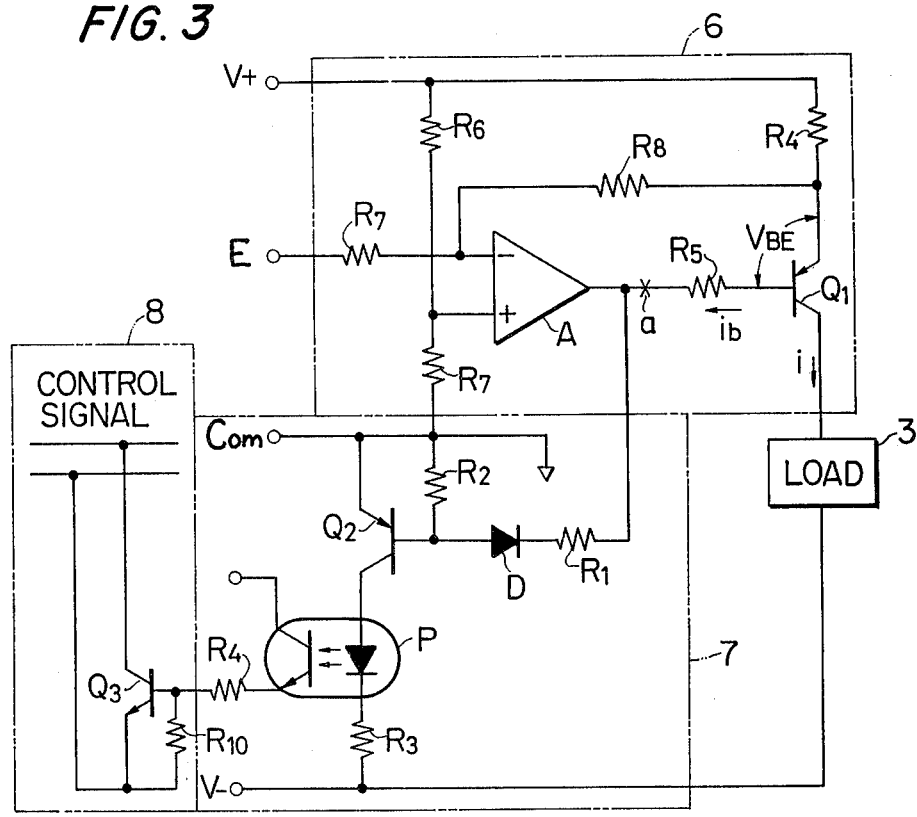
FIG. 3 is a circuit diagram showing portions of the system in greater detail.

FIG. 3 illustrates a circuit appropriate for use in the control system shown in FIG. 1, comprising the output stage of the converter circuit 6, the open-circuit detecting circuit 7, and the shorting circuit 8. The circuit comprises an operational differential amplifier A, resistors $R_1$ to $R_9$, transistors $Q_1$ to $Q_3$, a diode D and a photocoupler P, connected as shown. A voltage E at the inverting input of operational amplifier A is developed into a DC output current $i$ by transistor $Q_1$ and feedback resistor $R_8$. The potential $V_a$ at point $a$ is given as $$V_a = V_+ - iR_4 - V_{BE}(Q_1) - i_b R_5$$

where $i$ is the current flowing in the load 3, $V_+$ is the positive supply voltage, $V_{BE}(Q_1)$ is the base-to-emitter voltage of transistor $Q_1$, and $i_b$ is the base current of transistor $Q_1$. The resistance of $R_4$ is made small enough so that, since $V_{BE}$ and $i_b R_5$ are considerably smaller than $V_+$, $V_a$ will be larger than zero ($V_a > 0$). Therefore the voltage applied to the diode D forms a reverse bias and the diode D remains in the off state, causing the transistor $Q_2$ to be in the off state. Accordingly, no signal is available from the photocoupler P, and the transistor $Q_3$ connected in the shorting circuit 8 across the signal line remains in the off state.

If, however, the circuit comprising the load 3 becomes open, the current $i$ ceases and the emitter voltage of transistor $Q_1$ becomes nearly equal to $V_+$. The potential at the inverting input point of the amplifier $A$ rises through the feedback resistor $R_8$, causing the voltage $V_a$ at the point $a$ to be driven far into the negative, which in turn causes the diode D to turn on. As a result, the transistor $Q_2$ turns on, and the transistor $Q_3$ also turns on through the photocoupler P and becomes conductive, thereby shorting the signal line.

Figure 4:
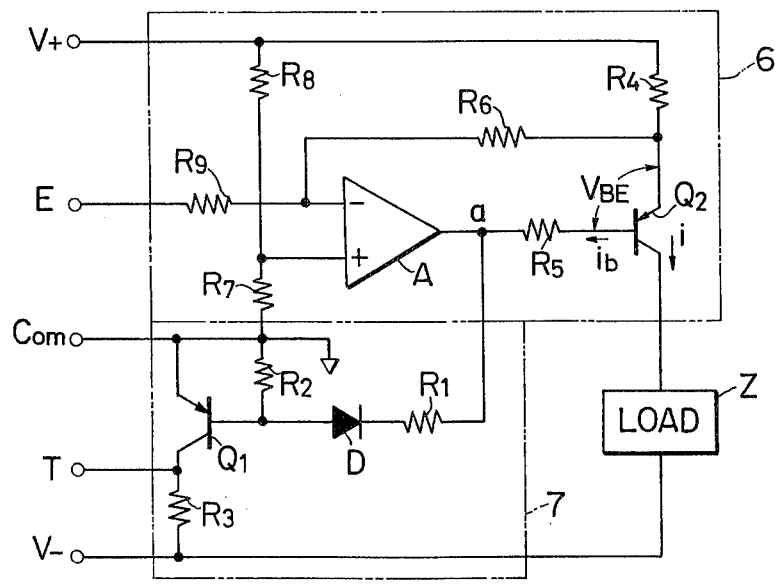
FIG. 4 is a circuit diagram of another embodiment of the invention.

The open-circuit detecting circuit 7 may also take the form shown in FIG. 4 where the photocoupler P is not used, and the open-circuit detection signal for driving transistor $Q_3$ is made available at the terminal T at the collector of transistor $Q_1$. If desired, a light-emitting diode may be used in place of the diode D whereby the occurrence of open circuit can be visually detected.

Although specific embodiments of the invention have been disclosed herein in detail, it is to be understood that this is for the purpose of illustrating the invention, and should not be construed as necessarily limiting the invention, since it is apparent that many changes can be made to the disclosed structures by those skilled in the art to suit particular applications.

We claim:

1. In a control system of the type comprising controller means for providing a control signal on a signal line, and DC output means for converting the control signal on the signal line into a DC current output signal for supply to a current loop including one or more load devices, the improvement which comprises:
   open-circuit detecting means for detecting an open circuit condition in the load current loop;
   shorting means in the DC output means for shorting the signal line in response to detection of an open-circuit by the open circuit detecting means; and
   level detecting means for detecting the shorting of the signal line;
   whereby an indication of an open-circuited load condition may be supplied back to the controller means without use of an added signal carrying line.

2. A control system as claimed in claim 1 wherein the control signal is converted into a DC current output signal varying in a range above a predetermined minimum value, and wherein the open-circuit detecting means detects an open circuit condition in the load current loop by detecting the fall of the DC current output signal below the predetermined minimum value.

3. A control system as claimed in claim 2 wherein the DC output means comprises an operational amplifier and means for feeding back the voltage of the load current loop to the input of the operational amplifier, and wherein the open circuit detecting means responds to variations in the output voltage of the operational amplifier.

4. A control system as claimed in claim 3 wherein the shorting means comprises a transistor connected across the signal line, and wherein the open circuit detecting means comprises a diode switched into a conductive state when the output voltage of the operational amplifier falls during an open circuit condition, and means switched into a conductive state by the diode for supplying a signal to cause the transistor across the signal line to become conductive and to thereby short the signal line.

5. A control system as claimed in claim 4 wherein the means rendered conductive by the diode includes a photocoupler.

* * * * *